(12) United States Patent
Struck et al.

(10) Patent No.: US 6,407,539 B1
(45) Date of Patent: Jun. 18, 2002

(54) APPARATUS AND METHOD FOR DETERMINING LIGHTNING PROTECTION OF A BUILDING

(75) Inventors: Jacob K. Struck, Lake Hopatcong; Philip J. Magnotti, Westfield; John C. Jessee, Stanhope, all of NJ (US); Henry H. Lee, Long Island City, NY (US); George K. Khowong, Fairlawn, NJ (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 15 days.

(21) Appl. No.: 09/711,689

(22) Filed: Nov. 9, 2000

Related U.S. Application Data

(60) Provisional application No. 60/165,592, filed on Nov. 10, 1999.

(51) Int. Cl.$^7$ ............................................. G01R 31/02
(52) U.S. Cl. ...................................................... 324/72
(58) Field of Search ......................... 324/72, 202, 500, 324/509, 520, 536

(56) References Cited

U.S. PATENT DOCUMENTS

| | | | |
|---|---|---|---|
| 4,142,143 A | * | 2/1979 | Daniel ........................ 324/127 |
| 5,365,179 A | | 11/1994 | Rogers |
| 5,502,371 A | * | 3/1996 | Youngquist ................. 324/202 |
| 5,654,641 A | * | 8/1997 | Query et al. ................ 324/260 |
| 5,929,625 A | | 7/1999 | Lewiner |

OTHER PUBLICATIONS

Mardiguian, Grounding and Bonding (Electromagnetic Interference and Compatibilty Ser.: vol. 2), pp. 10.27 to 10.29.

Plumey, Et Al., High Frequency Harmonic Input Impedance of An Antenna Embedded In A Conducting Half–Space, Electromatic Compatibility, 1983 Proceedings, pp. 45–50.

* cited by examiner

*Primary Examiner*—Diego Gutierrez
*Assistant Examiner*—Vincent Q. Nguyen
(74) *Attorney, Agent, or Firm*—Robert Beam; John Moran

(57) ABSTRACT

The present invention shows an apparatus and method for the determination of clearances for safety of personnel and safe storage of critical assets within a structure. The method comprises the steps of choosing appropriate test locations on top of the structure, using a test apparatus including a signal generator, a receiver and a computer, injecting low-level test currents at each test locations, measuring the resulting electromagnetic fields; calculating the transfer functions for the structure, and determining the internal energy levels that lightning strikes would cause inside the structure in order to determine a safe stand-off distance for critical assets or personnel within the structure.

5 Claims, 6 Drawing Sheets

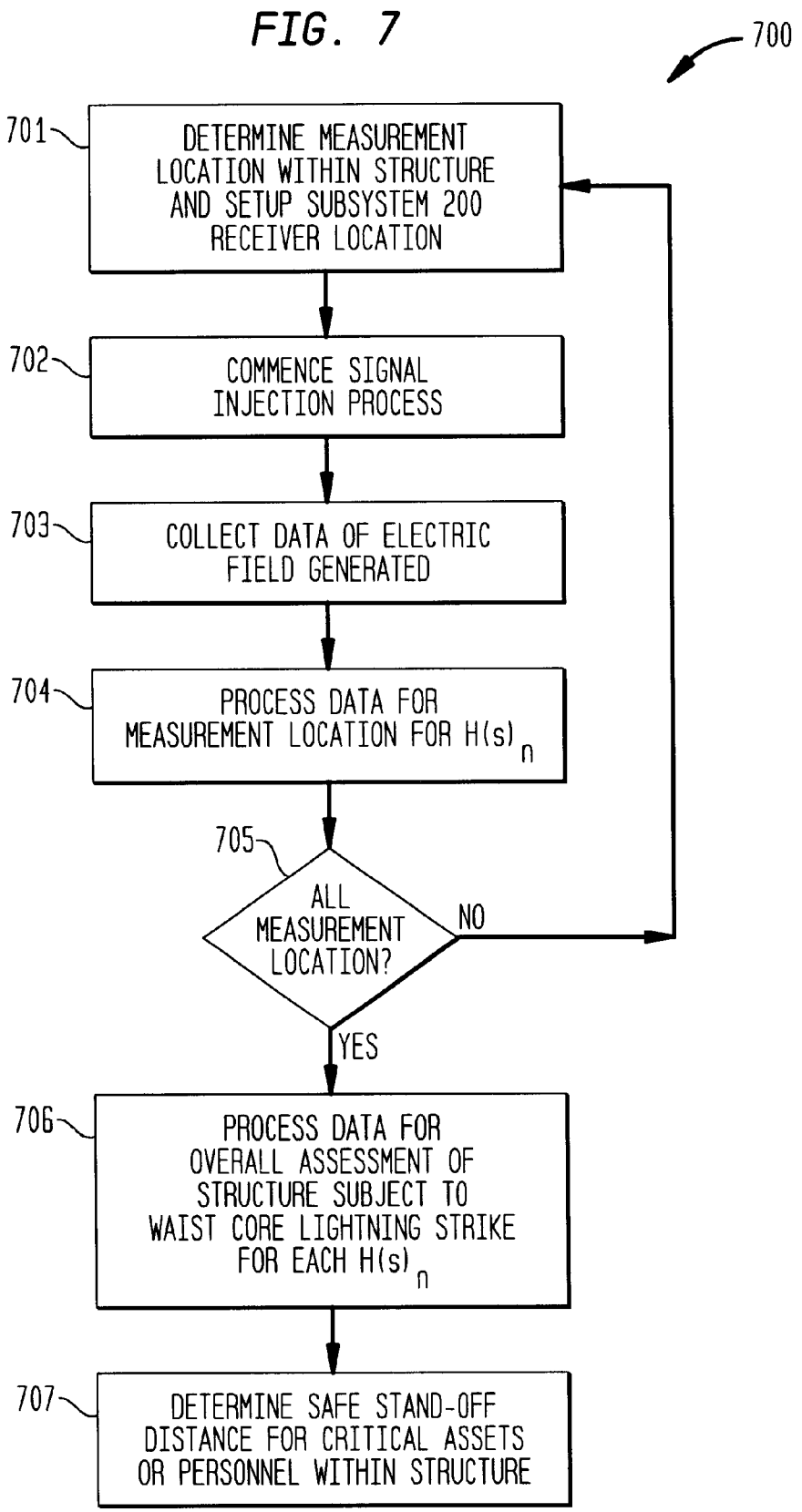

APPARATUS AND METHOD FOR DETERMINING LIGHTNING PROTECTION OF A BUILDING

CROSS REFERENCE TO RELATED APPLICATIONS

This application claims priority of U.S. Provisional Application No. 60/165,592, filed Nov. 10, 1999.

STATEMENT REGARDING FEDERALLY SPONSORED RESEARCH OR DEVELOPMENT

The invention described herein may be made, used or licensed by or for the United States Government for Government purposes without the payment of any royalties thereon or therefor.

BACKGROUND OF THE INVENTION

1. Field of the Invention

The present invention relates to the measurement and testing of structures for adequacy of lightning protection. In particular, the present invention provides an apparatus and method for accurately determining theoretical energy levels that a lightning strike causes within a tested structure and the need for appropriate remedial measures to protect personnel and critical assets.

2. Description of Related Art

In general, there is no systematic, reliable and accurate quantitative method available to determine the degree of lightning protection afforded by a structure, an external lightning protection system (LPS) for that structure, or for the combination of the structure and the lightning protection system.

Mardiguian, *Grounding and Bonding*, pps. 10.27 to 10.29, and Plumey, et al., "High Frequency Harmonic Input Impedance Of An Antenna Embedded In A Conducting Half-Space", Electromagnetic Compatibility, 1983 Proceedings, pp. 45–50, both discuss grounding lightning transients and refer to measuring ground impedance at frequencies above dc. The measurement is made using a grounding rod under test, an auxiliary grounding rod providing a current return, a reference grounding rod, a surge generator for injecting a current impulse through a matched resistor between the grounding rod under test and the first auxiliary grounding rod, and an oscilloscope or spectrum analyzer for measuring the voltage transients across a voltage divider network connecting the ground rod to be tested and the second auxiliary grounding rod. The impedance is determined from the ratio v/I of the probe to earth voltage to the injected current transient.

As a modeling methodology, this method suffers from the problem that how lightning strikes affect structures was not well understood until recently. Recent testing has demonstrated that a substantial amount of the energy of a lightning strike hitting a structure is dissipated in the metallic support elements of the structure, rather than the external lightning protection system.

Because the flow of lightning energy through a structure can damage or destroy critical assets such as sensitive electronic equipment or explosive materials within the structure, additional analysis has proven necessary.

Indeed, the most commonly used prior art lightning protection system measurement and testing method requires the measurement of the continuity and ground resistance from an air terminal to surrounding earth using the fall-of-potential method with an alternating current ohmmeter. The resistance value must be less than 10 to 25 Ohms, depending upon the governing regulation. A rigorous visual and mechanical inspection of all of the air terminals, conductors, fasteners and ground rods is necessary to assure the mechanical robustness of the external lightning protection system. No quantitative protection level can be calculated from such a method. Other versions of this ohmic technique require disassembling various individual components and conductors and measuring the continuity of key elements in the external lightning protection system, as well as the resistance to ground.

Prior U.S. Patents that deal with testing of a lightning protection system generally involve either direct current injection of a test signal or magnetically inducing a current in elements of the lightning protection system. For example, U.S. Pat. No. 4,142,143 teaches a method of measuring the admittance (conductance and reluctance) of a conductor to determine its continuity within a larger lightning protection system without the disassembly of the structure. Another example is U.S. Pat. No. 5,654,641, which teaches a method that measures the current division within a lightning protection system to qualitatively estimate whether protection is affordable in the vicinity of the particular conductor. U.S. Pat. No. 5,929,625 teaches a method of monitoring a lightning protection system with a device that continually monitors the lightning protection system using a magnetic circuit.

None of these methods provides accurate, quantitative measurements that can be used to calculate the expected energy levels within the structure from a lightning strike or recommended modification of either locating critical materials within the structure or ways for modifying a structure or the combination of the lightning protection system and the structure to prevent damage when a lightning strike occurs.

Other prior art U.S. Patents that deal with automated testing of grounding systems at frequencies above dc using automated control apparatus include U.S. Pat. No. 5,365,179. This reference teaches a method and apparatus for measuring ground to earth impedance at frequencies above dc using a computer controlled instrument to implement a three point measurement or a fall-of-potential method using three ground paths and a plurality of discrete frequencies in the range of from 5 Hz to 200 MHz. The complex impedance vector array for each frequency selected in the range may be determined for identifying antenna effects to improve the quality of the ground and improved ground path selection for an electrical system. This patent does not describe methods of determining the lightning protection effectiveness of a structure and its lightning protection system, nor does it recognize methods for deriving a transfer function for a structure, the characteristics of a lightning strike and how it interacts with that structure or problems resolved by the instant invention.

One of the problems these prior methods represent is that they do not model accurately a structure with metallic elements or take into account that these metallic structural elements dissipate most of the energy incurred by a lightning strike. The present invention provides a direct, accurate and quantitative measurement and determination of protection of a structure by deriving a collection of transfer functions at various locations within the structure and using modeled excitation functions in the frequency spectrum of lightning that are convolved with these transfer functions to predict the affects of a worst case lightning strike. This information provided useful standoff distances for minimizing harm to personnel and damage to critical assets located within that structure.

BRIEF SUMMARY OF THE INVENTION

Objects of the Present Invention

The present invention provides an apparatus and measurement methodology that allows accurate, safe and practical determination of the degree of lightning protection for a structure having metallic structural elements. This is particularly useful for a structure that requires zones of safety for personnel or critical materials, such as computers, explosives or other critical assets. The apparatus in cooperation with frequency domain analytical method yields a quantitative protection level for a structure. The method of the invention includes:

i) determining the test locations, such as an air-terminal (lightning rod) or other metallic conductors at the top of the structure, for the measurement of the transfer functions of the structure;

ii) injecting a low-level test current into the test locations at multiple test frequencies and allowing the injected test current at each test frequency to flow through the metallic and other partially-conductive elements of the structure, and flow to the surrounding earth beneath the structure;

iii) measuring the electromagnetic fields (electric field, magnetic field, or both); The method of the invention includes:

i) determining the test locations, such as an air-terminal (lightning rod) or other metallic conductors at the top of the structure, for the measurement of the transfer iv) calculating and synthesizing the transfer functions for each test location within the structure; and, v) determining the internal energy levels that lightning strikes would cause inside the structure using probable models of a lightning event at these various test points.

The collection of transfer functions from the various injection points of measurement locations can then be derived using the method of the invention, from which the effect of an extreme lightning strike can be calculated. The safe separation distance from walls, ceilings, or other conductive surfaces can be calculated from the calculated energy levels expected in a lightning strike event.

The resulting a priori energy levels a lightning event presents to the structure provides information to modify the lightning protection system of the structure. Alternatively, the critical locations where people reside may be relocated within the structure, or materials or equipment located within the structure may be relocated, providing enhanced safety for the personnel and minimizing damage to critical assets located within the structure.

The apparatus of the present invention includes a signal generator to inject test currents at multiple frequencies into the structure and a calibrated antenna and frequency spectrum analyzer to measure the electromagnetic fields created by the excitation signal for several frequencies within the spectral region of lightning. This is done using either manual or automated computer control of the signal generator in association with data compilation at each particular frequency for determining the transfer function at that location.

It is an object of the present invention to provide a frequency-domain measurement testing apparatus using either manual or automated embodiments of the apparatus to determine the equivalent collection of transfer functions of multiple test points within a structure (such as an airport hanger, auditorium, warehouse, ammunition bunker or other structure having metallic structural elements) in the frequency spectral region occupied by lightning strikes to provide information of such strikes for modifications of the structure's lightning protection system or location of critical materials located therein.

It is a further object of the present invention to provide a testing method that includes exciting a structure with metallic structural elements using low-amplitude signals, within the same frequency range as lightning strike currents, to make effective measurements for deriving an electronic transfer function for determining how a lightning event will affect a structure, thus providing a non-destructive test method for modifying the structure to enhance safety and minimize damage to critical assets.

It is a still further object of the present invention to provide a testing method that includes using a continuous-wave signal generator to inject excitation current into any exterior metal conductor on the structure for deriving a lightning protection system transfer function.

It is another object of the present invention to provide a testing method that includes using an electric-field antenna within the structure to measure the resulting electric field generated by an excitation current.

It is another object of the present invention to provide a testing method that includes using a fiber optic data link to eliminate spurious pick-up by long cables, acting as parasitic antennas for deriving a lightning protection system transfer function for accurate determination.

It is another object of the present invention to provide a testing method that includes using a frequency spectrum analyzer to detect the low energy levels from an antenna and to reject noise and other spurious signals from corrupting the measurement for deriving a lightning protection system transfer function for accurate determination.

It is another object of the present invention to provide a testing method that includes using a magnetic-field antenna within the building to measure the resulting magnetic field generated by an excitation current.

It is another object of the present invention to provide a testing method that includes using a calibrated radio-frequency receiver in place of the frequency spectrum analyzer to detect the low energy levels from an antenna and to reject noise and other spurious signals from corrupting the measurement for greater accuracy in determining a lightning protection system transfer function.

It is another object of the present invention to provide a testing method that includes using a signal generator coupled to an externally-located magnetic field antenna so as to magnetically excite the structure under test, rather than inject excitation currents through direct connection to the structure as alternative embodiment of the invention.

The other objects, features and advantages of the present invention will become more apparent in light of the following detailed description of the preferred embodiments thereof.

Summary of the Present Invention

According to a preferred embodiment of the present invention, there is provided an apparatus for the determination of the degree of lightning protection of a structure having metallic structural elements by determining an electromagnetic field transfer function for each test location selected from among metallic conductors, such as lightning rods, located in the proximity of the top of said structure, which apparatus comprises:

a) a signal generation instrumentation subsystem which can be operatively connected to each said test location in succession and the earth surrounding said structure, which signal generation instrumentation subsystem is capable of injecting a low-level test current at a plurality of specific test frequencies into a selected test location;

b) a receiver instrumentation subsystem comprising:
  i) an internal component intended to be disposed within said structure to measure the electric field created by the injection of said low-level test current into said selected test location and comprising:
    A) an electric field antenna which may be disposed within said structure to measure the electromagnetic field at the position where said antenna is disposed;
    B) a fiber optic transmitter operatively connected to said antenna and capable of converting the electromagnetic field measurement of said antenna into an optical signal; and,
    C) an optical fiber cable operatively connected to said fiber optic transmitter and capable of conducting said optical signal;
  ii) an external component intended to be disposed outside said structure to analyze the electric field created by the injection of said low-level test current into said test location and comprising:
    A) an fiber optic receiver operatively connected to said optical fiber cable and capable of converting said optical signal to an electrical signal;
    B) a frequency spectrum analyzer operatively connected to said fiber optic receiver and capable of converting said electrical signal to an electric field value in volts RMS (root-mean-square) per meter; and,
c) a computing device operatively connected to said signal generation instrumentation subsystem and said receiver instrumentation subsystem and capable of matching the data received from said receiver instrumentation subsystem with the low-level test current injected at each test location by said signal generation instrumentation subsystem, and analyzing such data to provide an overall assessment of the ability of said structure to adequately dissipate the energy of a lightning strike in order to determine a safe stand-off distance for critical assets or personnel within the structure.

According to another embodiment of the present invention, there is provided a method for the determination of clearances for safety of personnel and safe storage of critical assets within a structure, which method comprises the steps of:

i) evaluating the appropriate test locations for a structure and selecting a plurality of said test locations from among metallic conductors, such as lightning rods, located in the proximity of the top of said structure;

ii) equipping said structure with a test apparatus comprising:
  a) a signal generation instrumentation subsystem which can be operatively connected to each said test location in succession and the earth surrounding said structure, which signal generation instrumentation subsystem is capable of injecting a low-level test current at a plurality of specific test frequencies into a selected test location;
  b) a receiver instrumentation subsystem comprising:
    i) an internal component intended to be disposed within said structure to measure the electric field created by the injection of said low-level test current into said selected test location and comprising:
      A) an electric field antenna which may be disposed within said structure to measure the electromagnetic field at the position where said antenna is disposed;
      B) a fiber optic transmitter operatively connected to said antenna and capable of converting the electromagnetic field measurement of said antenna into an optical signal; and,
      C) an optical fiber cable operatively connected to said fiber optic transmitter and capable of conducting said optical signal;
    ii) an external component intended to be disposed outside said structure to analyze the electric field created by the injection of said low-level test current into said test location and comprising:
      A) an fiber optic receiver operatively connected to said optical fiber cable and capable of converting said optical signal to an electrical signal;
      B) a frequency spectrum analyzer operatively connected to said fiber optic receiver and capable of converting said electrical signal to an electric field value in volts RMS (root-mean-square) per meter; and,
  c) a computing device operatively connected to said signal generation instrumentation subsystem and said receiver instrumentation subsystem and capable of matching the data received from said receiver instrumentation subsystem with the low-level test current injected at each test location by said signal generation instrumentation subsystem, and analyzing such data to provide an overall assessment of the ability of said structure to adequately dissipate the energy of a lightning strike in order to determine a safe stand-off distance for critical assets or personnel within the structure;

ii) injecting a plurality of low-level test currents into each said test locations, each said test current at a specific test frequency and allowing each said injected test current at each specific test frequency to flow through any metallic or other conductive elements of said structure, into the surrounding earth beneath the structure;

iii) measuring the electromagnetic fields;

iv) calculating the transfer functions for each test location selected for said structure; and, v) determining the internal energy levels that lightning strikes would cause inside the structure using probable models of a lightning event at these various test points in order to determine a safe stand-off distance for critical assets or personnel within said structure.

BRIEF DESCRIPTION OF THE SEVERAL VIEWS OF THE DRAWINGS

FIG. 6b shows an expanded view of the rise-time of FIG. 6a.

FIG. 7 shows a flow diagram of the method of the invention implemented by the hardware shown in FIG. 1.

DETAILED DESCRIPTION OF THE INVENTION

Figure 1:
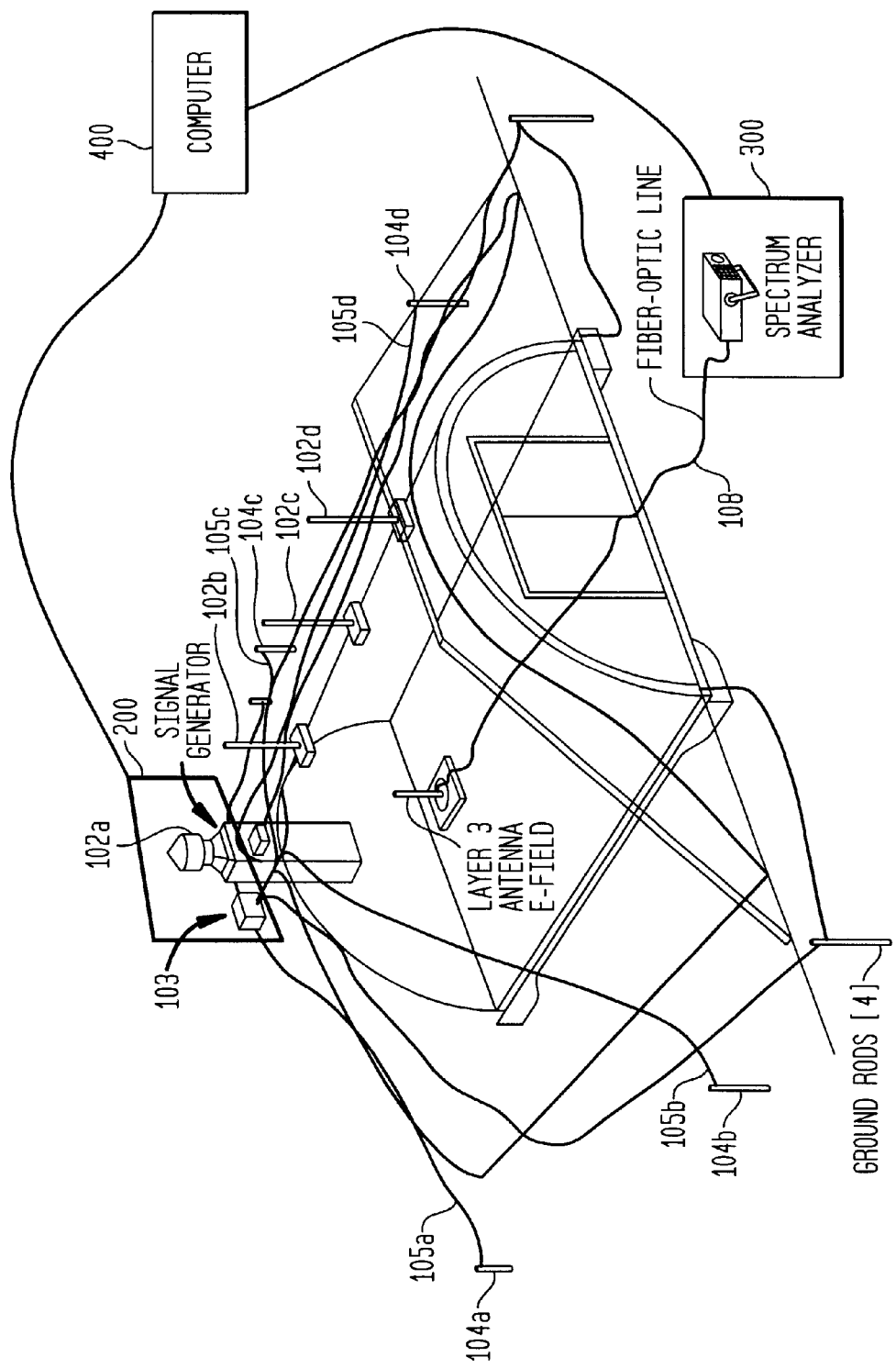
FIG. 1 is a prospective view of an exemplary testing set-up of the present invention.

FIG. 1 shows in exemplary form a testing arrangement of a structure using the invention where instrumentation is positioned around the structure as shown. The invention herein is preferably used in conjunction with a recommended lightning protection system as described in ANSI/IEEE Std 142-1982, *IEEE Green Book*, Chapter 3, Section 3.3 under "Lightning Protection Grounding." In particular, this reference section describes five classes of structures. The present invention is particularly suitable for use with structures having metallic structural elements. The instant invention can be used for examining various structures with or without an external lightning protection system. The examined points for testing are the worst case scenario locations as to external locations where lightning strikes the structure and internal locations where people or critical assets reside.

The structure 101 depicted in FIG. 1 is a reinforced concrete, earth-covered ammunition storage magazine or bunker. The external lightning protection air-terminals (lightning rods) 102a–d serve to attract and intercept approaching lightning flashes and provide a controlled attachment point for the flashes. The signal generation instrumentation subsystem 200 and receiver instrumentation subsystem 300 are shown in relation to the structure 101 being tested. Additionally, control leads from a computer 400 can be attached directly or remotely to transmit control signals to both the generation subsystem 200 and the receiver subsystem 300 for automated data acquisition control for deriving the transfer function as discussed below. The computer 400 shown in FIG. 1 can be two separate computers that individually in synchronized operation can inject test signals by the generator subsystem 200 and acquire data by the receiver subsystem 300, so as to minimize parasitic antenna affects and corrupting acquired data.

A signal generator 103 capable of generating a multiplicity of frequencies in the spectral region of lightning strikes is situated at the top of the structure 101 at a convenient point of attachment (in the illustration of FIG. 1, the rear air terminal 102a). One lead of the signal generator 103 is attached to the air terminal 102a. A signal return path is created through an array of four ground rods 104a–d that have been driven into the earth symmetrically around the bunker 101. Four heavy-gauge ground leads 105a–d are attached, one end of each to each ground rod 104a–d, and lead to the top of the structure 101 to a point proximate to the point of attachment at the air terminal 102a. These ground leads 105a–d should typically be no more than 50 feet long to minimize inductive, and resistive effects. The ground rods 104a–d are placed symmetrically around the structure to uniformly distribute an injected signal through the surrounding earth, simulating natural lightning. The ground leads 105a–d are joined to a common terminal and connected to the other lead of the signal generator 103. Thus, an injected signal current distributes itself through the conductors of the external lightning protection system, the lightening rods air terminals, 102a–d and through the steel reinforcing bars (re-bar) of the structure 101, diffusing through the concrete and into surrounding earth in much the same way as would the current from a natural lightning strike. In addition, an injected signal current would generate the same type of electromagnetic fields that would be generated by natural lightning, albeit at a significantly reduced level. If the resultant fields are measured, an electronic "transfer function" from the injection point at the air terminal 102a to any desired measurement point in or proximate to the structure 101 can be calculated, using the measured field levels and value of the injected current. This transfer function describes the portion of the lightning energy that will be transported to any items located at the particular measurement point. A mathematical representation of extreme lightning can then be convolved with the derived transfer function, and the electromagnetic field levels due to an extreme lightning strike can be calculated. Operating in the frequency domain using a transfer function and convolution methods yields results incurred by the excitation function (modeled lightning strike).

Figure 2:
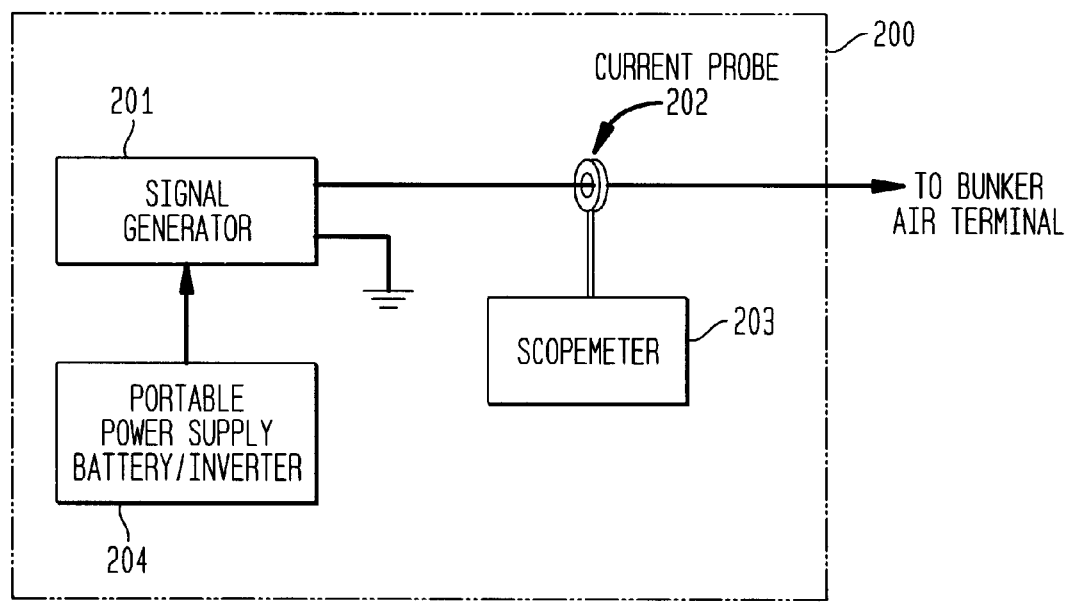
FIG. 2 is a block diagram of signal generating instrumentation of the apparatus used for manual determination of the transfer function.

FIG. 2 shows the signal generation instrumentation subsystem 200 used with the apparatus of the invention. A signal generator or sinusoidal function generator 201, capable of generating frequencies in the range of 5 kilohertz to 2 megahertz is preferably used, with a peak-to-peak amplitude of 10 volts into a 50 ohm load serving as a signal source. In the practice of this invention, a Hewlett-Packard Model 33120A can be used advantageously. One lead of the generator 201 is connected to the array of ground rods 104a–d by way of the ground leads 105a–d of FIG. 1. The other lead of generator 201, which ultimately connects to the air terminal 102a of FIG. 1, is passed through a current transformer 202 to inductively couple with the magnetic field that results from the signal injection current flow. It provides a calibrated voltage output that is directly proportional to the current flowing in the signal injection lead. In the illustrated embodiment, a Pearson Model 4100 Current Transformer was used advantageously, but any current transformer or current probe could be employed, as long as it had the proper frequency response and sufficient sensitivity. The current transformer 202 is coupled to an oscilloscope or voltmeter 203 so that its output voltage can be measured. In the illustrated embodiment, a Fluke ScopeMeter, Model 105B was used because of its portability. But any oscilloscope or voltmeter could be employed, as long as it had the proper frequency response and sufficient sensitivity. The measured voltage is converted to current by multiplying the output of the current transformer 202 by its calibration factor, expressed in Amperes per Volt. A portable power supply 204 provides normal alternating current (AC) power to the signal generator 201 and the oscilloscope 203 (as required) via a 120 Volt AC inverter, powered by a 12 volt marine battery.

Figure 3:
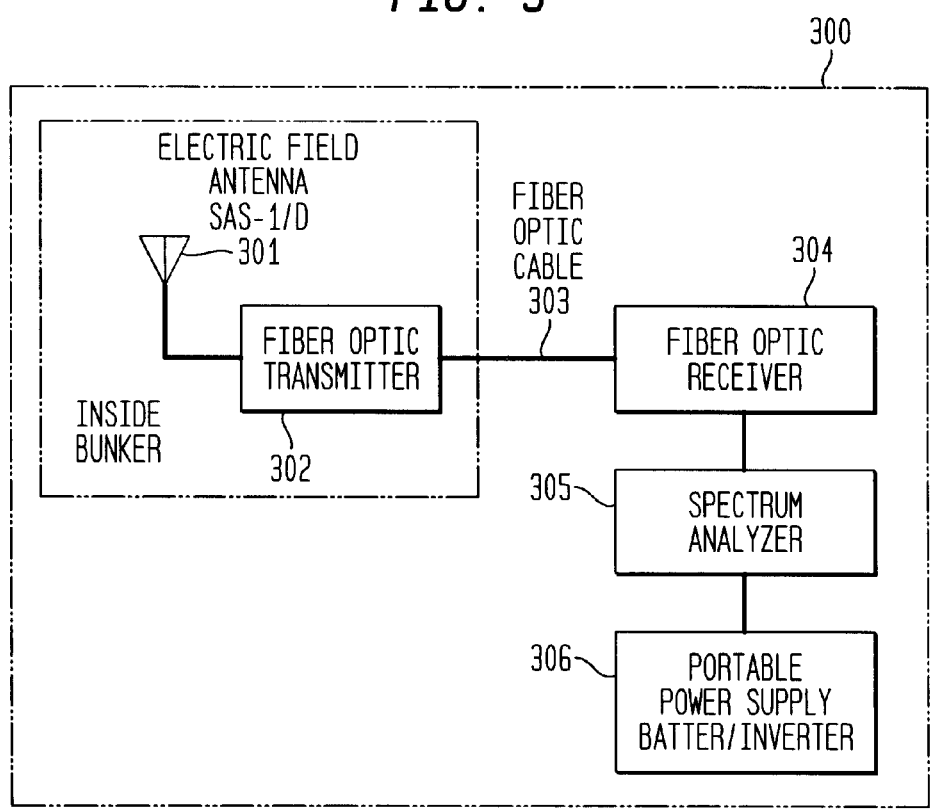
FIG. 3 is a block diagram of one embodiment of the receiving instrumentation for the testing apparatus.

FIG. 3 shows components of the receiver instrumentation subsystem (300 of FIG. 1). This subsystem 300 is located both within and without the structure 101. The electric field vector that is created by an injected signal current is measured with this apparatus 300. A calibrated electric field antenna 301 is placed at appropriate measurement positions or stations within the structure 101 so as to capture the worst-case electromagnetic field levels. In general, to intercept the highest electromagnetic field levels, the antenna should be positioned within about 1 meter of the walls, ceiling or any metal objects within the bunker 101 and approximately directly under the signal injection point 102a in FIG. 1, or as nearly so as practicable. An ARA Model SAS-1D or an ARA Model ADA-120A antenna can be employed advantageously in this embodiment, but any electric field antenna could be employed provided it had the proper frequency response, low enough noise figure and sufficient sensitivity. The output of the antenna 301 is connected to a low-noise, battery-powered fiber optic transmitter 302 and converted to an optical signal for transmission. A fiber optic cable 303 carries the optical signal to a fiber optic receiver 304, having characteristics which match those of the fiber optic transmitter 302. This optical fiber receiver 304 may be located outside the structure 101. A Dymec fiber optic receiver (Model 6713) and transmitter (model 6712), with compatible Dymec fiber optic cable have been employed advantageously in the illustrated embodiment, but any set of fiber optic transmitter/fiber/receiver can be used that has a performance equivalent to the Dymec system. Fiber optic transmission is preferred to minimize any potential corruption of electromagnetic field measurements incurred by the use of long metallic cables or conductors, which can act as spurious undesired antennas. For the same reason, the metallic "footprint" of the measurement hardware within the building should be kept to a minimum, with all metallic leads and cables being as short as possible, and equipment enclosures situated as close to one another as possible to minimize unwanted parasitic antenna effects.

The fiber optic receiver 304 is situated remotely (at least about 50 feet) from the structure 101, along with the additional components of the receiver instrumentation subsystem 300 to minimize parasitic antenna effects from these components as well. The output of the fiber optic receiver 304 is fed to a frequency spectrum analyzer 305, which has high sensitivity and high frequency selectivity. In the illustrated embodiment, a Hewlett-Packard Model 8562A was used advantageously, because of its high sensitivity, high frequency selectivity and portability. But any frequency spectrum analyzer could be employed, as long as it had the proper frequency coverage, sensitivity and selectivity. The components of the receiver instrumentation subsystem 300 are preferably powered by a portable power supply 306, and a duplicate of the power supply employed with the signal generation instrumentation subsystem is suitable, except that a greater power output may prove necessary to accommodate the spectrum analyzer's power requirements. The output of the electric field antenna 301 is measured by the frequency spectrum analyzer 305 in units of volts RMS (root-mean-square). By using the calibration data of the electric field antenna 301, . the measurement in volts RMS can be converted to electric field units of volts RMS per meter, using the appropriate antenna factor value presented for each frequency of measurement.

Thus, obtaining a complete transfer function for a particular measurement location would require placing the electric field antenna 301 and fiber optic transmitter 302 at the desired location and tuning the signal generator 201 to a specific frequency within the desired spectral range. The injected current level at that frequency would then be measured using the current transformer 202 and oscilloscope 203 and recorded. The spectrum analyzer 305 would also be tuned to the same frequency as the signal generator 201 and the output level of the electric field antenna 301 recorded at that frequency. This process would be repeated for a number of frequencies sufficient to get a representative estimate of the transfer function's shape versus frequency. If the electric field antenna 301 is oriented to measure the vertical electric field vector, the electric field strength measured by the electric field antenna 301 would be multiplied by the internal height of the structure 101, from floor to ceiling, to produce the total floor-to-ceiling voltage within the structure 100 caused by the injected signal. If the calculated floor-to-ceiling voltage is then divided by the injected current level at the tested frequency, a complex transfer function impedance in Ohms is obtained for each tested frequency. In an automated embodiment of the apparatus of the present invention, a collection of test data at discrete frequencies are obtained for synthesizing a transfer function $H(s)_n$ at a test location within the structure 101.

Figure 4:
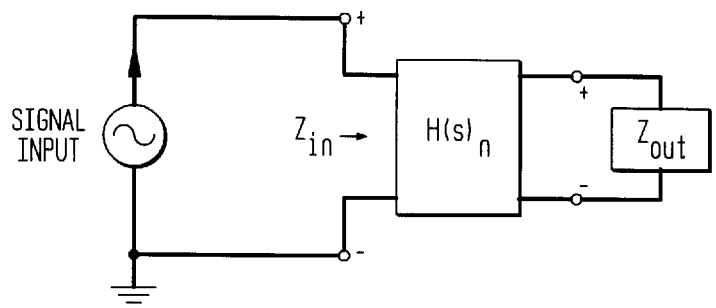
FIG. 4 shows elementary model of a transfer function $H(s)_n$ at a particular test point within the structure with an excitation function representative of either the injected test signal or a simulated lightning strike.
Figure 5:
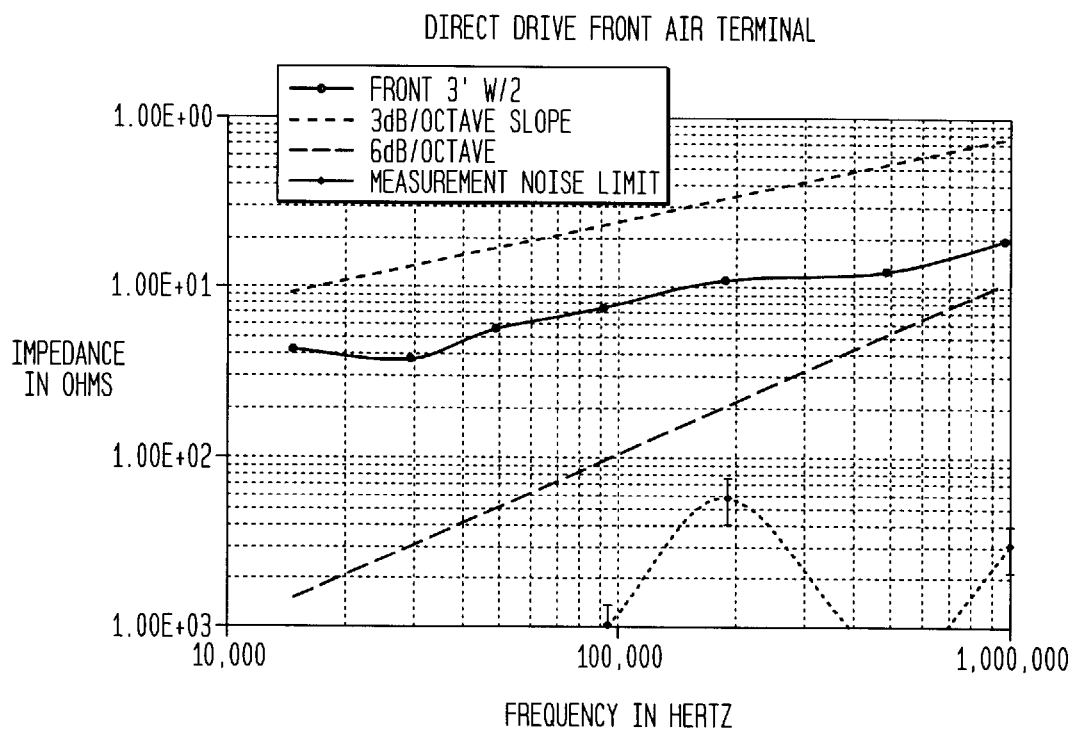
FIG. 5 is an exemplary plot of an impedance transfer function $H(s)_n$ versus frequency (Hz) at a particular test point.

FIG. 4 shows an elementary model of the transfer function $H(s)_n$ at a particular test point within the structure 101 having an excitation function representative of either the injected test signal from a signal generator instrumentation subsystem 200 or a simulated lightning strike as discussed below. The derivation of the transfer function is taught in a paper presented at the International Conference on Lightning Protection in Berlin 1993 entitled "Using Transfer Functions as a Method for Predicting Lightening Effects on Munitions Storage Bunkers," by J. K. Struck, et al.

Using network synthesis methods, a canonical network of discrete components (resistors, inductors with or without capacitors) a synthesized complex polynomial can be constructed using numerical analysis. Typically, a resistive, inductive model is used for representing the transfer function.

Model of Lightning Excitation:

Extreme lightning parameters are continually being modified as the body of measurements on natural lightning increases and as measurement accuracy increases. Lightning parameter statistics are expressed using log normal distributions. To characterize extreme lightning parameters, the 99th percentile values are used. The 99% of all lightning flashes have less extreme parameters than the values presented. Moreover, the frequency spectrum bounds for an extreme lightning strike are established for use with the transfer function.

Extreme lightning strike characteristics can be derived from the works of: Cianos, N. and E. T. Pierce, *A Ground Lightning Environment for Engineering Use*, SRI Report, Project 1834, August 1972; Uman, M. A. *The Lightning Discharge*, Academic Press, New York, 1987; Berger, K., R. B. Anderson, and H. Kroniger, "Parameters of Lightning Flashes", *Electra*, no. 41, 23–27; Krider, E. P., and M. A. Uman, "Naturally and Artificially Initiated Lightning", *Science*, Oct. 27, 1989 and Fisher, R. J., M. A. Uman, R. Thottapphillil, V. A. Rakov, J. D. Goldberg, and G. H. Schnetzer, "Parameters of Triggered Lightning in Florida and Alabama", *J. Geophys Res.*, 98,22,8887–22, 902,1993.

In particular, Merewether, K. O., "Maximum Lightning-Induced Voltages and Recommended Isolation Distances in Nuclear Explosive Areas at Pantex" Sandia National Laboratories technical memorandum to Tolk et al, Dec. 31, 1997, a double-exponential approximation is presented of the current waveform found in an extreme lightning strike. The resulting parameters replicate critical extreme lightning characteristics. This mathematical representation is used to determine lightning-induced energy extremes within structures and other electromagnetic environments. Merewether's coefficients produce a lightning-like waveform whose combined parameters represent those extreme values individually found in one percentile lightning strikes (thus, much more than 99% of all lightning strikes are less extreme) and are as follows:

| | |
|---|---|
| Peak Current: | 200 KA |
| Peak Rate of Rise: | 400 KA/micro-Sec |
| Total Action: | $3 \times 10^6$ A²-Sec |

Merewether's prototype double-exponential lightning strike equation form is as follows:

$$I(t)=Io(e^{-\alpha \cdot t}-e^{-\beta \cdot t})$$

where, $$\alpha := \frac{1}{144.632210^{-6} \cdot \sec}$$

$$\beta := \frac{1}{0.510090710^{-6} \cdot \sec}$$

Io=204.759 KA

The spectral energy of the lightning current waveform will occupy a band of frequencies that is bounded at the lower end by the duration of the stroke and at the upper end by the rise-time of the leading edge. Calculating upper and lower frequency bounds of spectral energy, using the commonly accepted time-constant-to-cutoff-frequency approximation for low-order systems, Lower Frequency Bound:

$$F\alpha := \frac{0.35}{2.197} \cdot \alpha$$

Fα=1.101·KHz

Upper Frequency Bound:

$$F\beta := \frac{0.35}{2.197} \cdot \beta$$

Fβ=312.313·KHz

Setting up discrete time steps for plotting:

Tsteps=100C
Tmax=500·10⁻⁶·sec
i=0 . . . Tsteps−1

$$t_i := \frac{T\max}{Tsteps - i}$$

Evaluating equation:

$$I_i = Io \cdot (\exp(-\alpha \cdot t_i) - \exp(-\beta \cdot t_i))$$

max(I)=199.999·KA

Figure 6A:
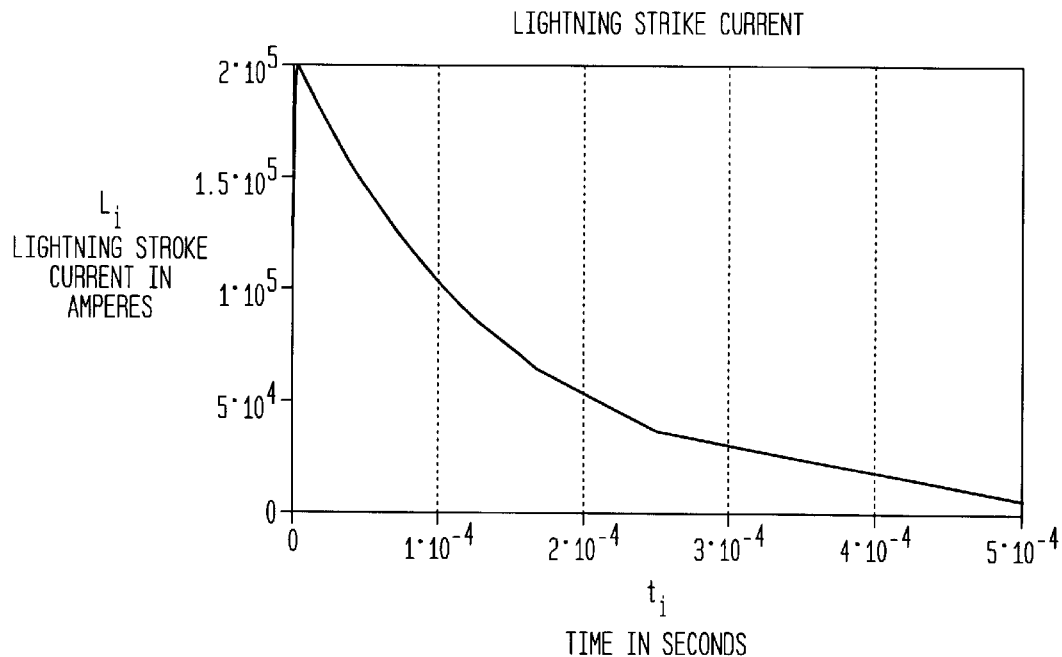
FIG. 6a shows a generalized lightning strike of a lightning event that is used for a modeling excitation function.
Figure 6B:
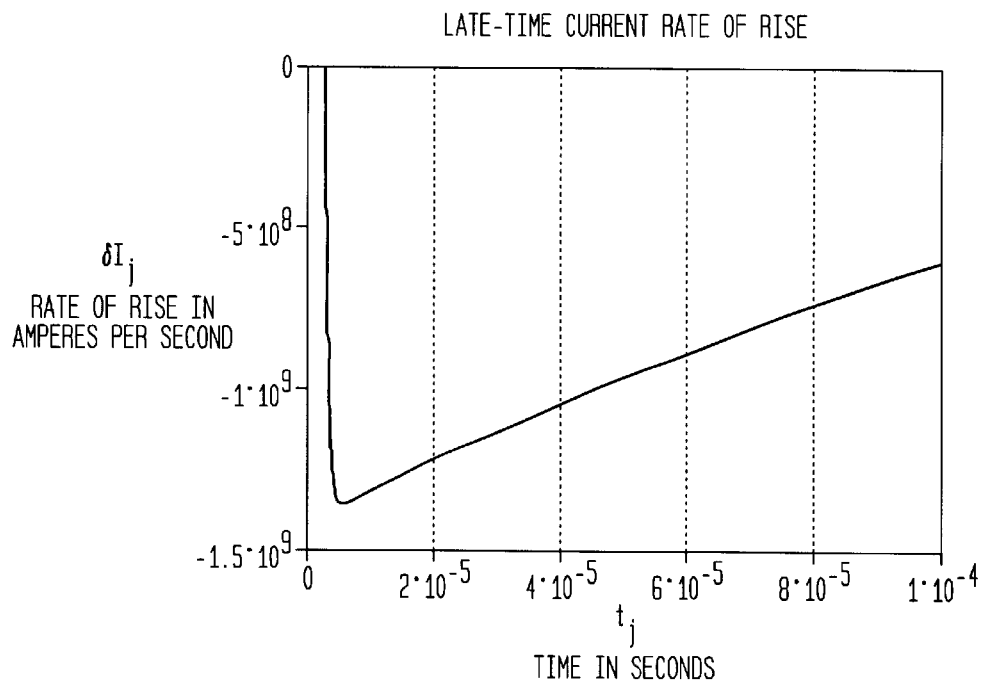

Peak Current in Amperes is as shown in FIG. 6a and late rise-time is shown in FIG. 6b.

Differentiating, j=0 . . . Tsteps−2

$$\delta I_j := \left[ \frac{I_{(j+1)} - I_j}{t_{(t+1)} - t_j} \right]$$

min(δI)=−1.355·10⁶·sec⁻¹·KA

Figure 6C:
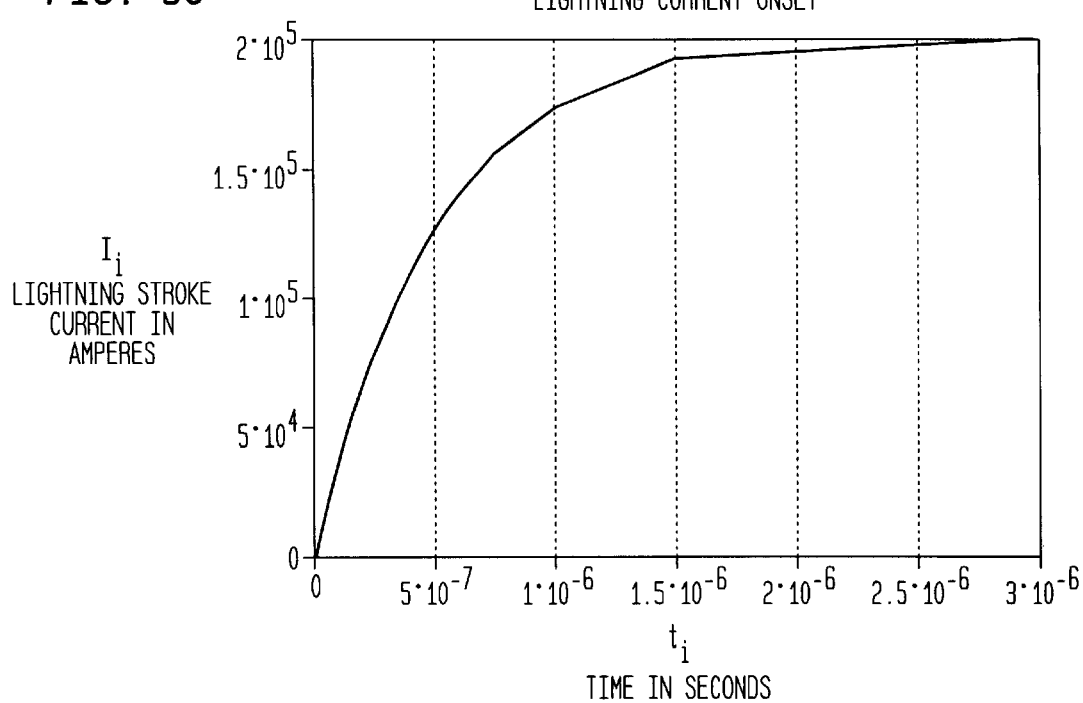
FIG. 6c shows lightening current onset for the modeling procedure.

Expanding time axis to evaluate rise-time with finer time resolution is as shown in FIG. 6c, Tsteps=50C
Tmax=3·10⁻⁶·sec
i=0 . . . Tsteps−1

$$t_i := \frac{T\max}{Tsteps - i}$$

$I_i = Io \cdot (\exp(-\alpha \cdot t_i) - \exp(-\beta \cdot t_i))$ as shown in FIG. 6c.

Differentiating:

j=0 . . . Tsteps −2

$$\delta I_j := \left[ \frac{I_{(j+1)} - I_j}{t_{(j-1)} - t_j} \right]$$

max(δI)=3.953·10₈·sec₋₁·KA

Figure 6D:
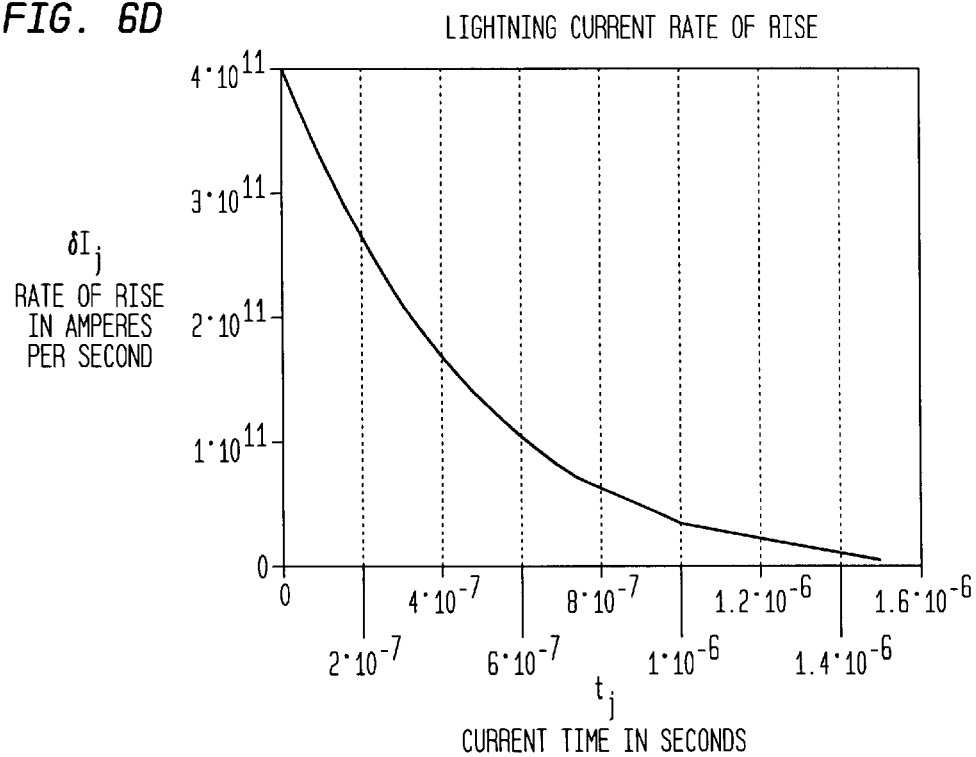
FIG. 6d shows lightening rate of rise for the modeling procedure.

Maximum Current Rate of Rise is shown in FIG. 6d.

Currently accepted 99$^{th}$-percentile extreme lightning parameters, based on research by Uman, Krider, Fisher, Cianos, Pierce, and others, are as follows:

| Lightning Stroke Parameter | 99$^{th}$ Percentile Value |
|---|---|
| Peak Current: | 200 Kiloamperes |
| Current Rate of Rise: | 400 Kiloamperes per Microsecond |
| Duration to 50% Falltime: | 100 Microseconds |
| Action: | 3 □ 10⁶ Ampere²-Seconds |

This is an exceptionally conservative model, since experience has shown that these extreme parameters are highly unlikely to occur together in a single lightning strike. A double-exponential representation is used in this embodiment, but any number of mathematical representations would be equally useful, provided the extreme parameters are satisfied. Attachment A presents the subject mathematical representation and calculates the spectral bounds. The mathematical representation of the extreme lightning current waveform is convolved with the synthesized transfer function polynomial expression to yield a time waveform that represents the floor-to-ceiling voltage due to attachment of an extreme lightning strike. A peak voltage level can be extracted from the voltage time waveform. By using recently developed voltage breakdown threshold levels, in units of Volts per Meter, for a point-to-plane air gap in the presence of lightning waveforms, a minimum safe standoff distance in meters can be calculated. The safe standoff distance represents the minimum distance between and any items stored in the building and the walls, ceiling and metal pipes, conduits, etc. that are part of the building structure. It is assumed that the stored items will be in intimate electrical contact with the floor and thus, to avoid direct arcing between the stored items and any other interior surface or metal pipes and conduits, adherence to the minimum-safe-standoff-distance-rule will prevent arcing. This assumption is conservative, but due to high humidity and accumulating dirt, etc., some conductivity to the floor generally occurs over time.

FIG. 7 shows in block form the method 700 of the invention that can be implemented in either a manual mode or an automated mode, depending on available hardware. In particular, the computer 400 in FIG. 1 can be either a single unit or two independent units that are in direct control of the signal generation instrumentation subsystem 200 and the receiver instrumentation subsystem 300, thereby avoiding parasitic antenna affects during a data acquisition event at a structure 101. Initially, the test set-up step 701 is determined for a given structure which is determined by the geometry of the structure 101, the material contents within the structure, the actual design of the structure 101, such as whether re-bar reinforcement is present, and the presence of a lightning protection system. The signal injection test points are determined and the actual data acquisition locations are determined during this step.

Next, at step 702, a signal injection commences by the signal generation subsystem 200 for the data acquisition process. This can be based upon real time data acquisition or using a digital signal processing event.

At step 703, data is collected by the receiver subsystem 300 as to the electric field vector generated by the signal injection process.

Next, at step 704, the data is processed to determine the synthesizing transfer function $H(s)_n$ at that test location within the structure 101.

At step 705, a determination is made whether more test locations within the structure 101 should be tested. If not, the method at step 706 processes all the data of an overall assessment of the structure 101, subject to a modeled worst case lightning strike using the modeled lightening strike as discussed above. From this assessment, at step 707, the safe stand-off distances of a lightning strike can be determined for protecting personnel and critical assets within the structure.

Other features, advantages, and specific embodiments of this invention will become readily apparent to those exercising ordinary skill in the art after reading the foregoing disclosures. These specific embodiments are within the scope of the claimed subject matter unless otherwise expressly indicated to the contrary. Moreover, while specific embodiments of this invention have been described in considerable detail, variations and modifications of these embodiments can be effected without departing from the spirit and scope of this invention as disclosed and claimed.

What is claimed is:

1. An apparatus for the determination of the degree of lightning protection of a structure having metallic structural elements by determining an electromagnetic field transfer function for each test location selected from among metallic conductors, such as lightning rods, located in the proximity of the top of said structure, which apparatus comprises:
   a) a signal generation instrumentation subsystem which is operatively connected to each said test location in succession and the earth surrounding said structure, which signal generation instrumentation subsystem is capable of injecting a low-level test current at a plurality of specific test frequencies into a selected test location;
   b) a receiver instrumentation subsystem comprising:
      i) an internal component intended to be disposed within said structure to measure the electric field created by the injection of said low-level test current into said selected test location and comprising:
         A) an electric field antenna which is disposed within said structure to measure the electromagnetic field at the position where said antenna is disposed;
         B) a fiber optic transmitter operatively connected to said antenna and capable of converting the electromagnetic field measurement of said antenna into an optical signal; and,
         C) an optical fiber cable operatively connected to said fiber optic transmitter and capable of conducting said optical signal;
      ii) an external component intended to be disposed outside said structure to analyze the electric field created by the injection of said low-level test current into said test location and comprising:
         A) an fiber optic receiver operatively connected to said optical fiber cable and capable of converting said optical signal to an electrical signal;
         B) a frequency spectrum analyzer operatively connected to said fiber optic receiver and capable of converting said electrical signal to an electric field value in volts RMS (root-mean-square) per meter; and,
   c) a computing device operatively connected to said signal generation instrumentation subsystem and said receiver instrumentation subsystem and capable of matching the data received from said receiver instrumentation subsystem with the low-level test current injected at each test location by said signal generation instrumentation subsystem, and analyzing such data to provide an overall assessment of the ability of said structure to adequately dissipate the energy of a lightning strike in order to determine a safe stand-off distance for critical assets or personnel within the structure.

2. The apparatus of claim 1 wherein said receiver instrumentation subsystem further comprises a portable power supply.

3. The apparatus of claim 1 wherein said signal generation instrumentation subsystem further comprises:
   a) a connection component comprising:
      i) a plurality of ground rods driven into the earth symmetrically around the structure;
      ii) a collective terminal;
      iii) a plurality of ground leads, each operatively connected to a ground rod at one distal end thereof and said collective terminal at the other distal end thereof;
   b) a signal generator operatively connected to said collective terminal and said test location of said structure and capable of initiating a low-level test current at a plurality of specific frequencies;
   c) a current transformer operatively connected with said signal generator and said test location, and capable of inductively coupling with the magnetic field that results from said low-level test current; and,
   d) means to measure the output voltage of said current transformer.

4. The apparatus of claim 3 wherein said signal generation instrumentation subsystem further comprises a portable power supply.

5. A method for the determination of clearances for safety of personnel and safe storage of critical assets within a structure, which method comprises the steps of:
   i) evaluating the appropriate test locations for a structure and selecting a plurality of said test locations from among metallic conductors, located in the proximity of the top of said structure;
   ii) equipping said structure with a test apparatus comprising:
      a) a signal generation instrumentation subsystem which is operatively connected to each said test location in succession and the earth surrounding said structure, which signal generation instrumentation subsystem is capable of injecting a low-level test current at a plurality of specific frequencies into a selected test location;

b) a receiver instrumentation subsystem comprising:
  i) an internal component intended to be disposed within said structure to measure the electric field created by the injection of said low-level test current into said selected test location and comprising:
    A) an electric field antenna which is disposed within said structure to measure the electromagnetic field at the position where said antenna is disposed;
    B) a fiber optic transmitter operatively connected to said antenna and capable of converting the electromagnetic field measurement of said antenna into an optical signal; and,
    C) an optical fiber cable operatively connected to said fiber optic transmitter and capable of conducting said optical signal;
  ii) an external component intended to be disposed outside said structure to analyze the electric field created by the injection of said low-level test current into said test location and comprising:
    A) an fiber optic receiver operatively connected to said optical fiber cable and capable of converting said optical signal to an electrical signal;
    B) a frequency spectrum analyzer operatively connected to said fiber optic receiver and capable of converting said electrical signal to an electric field value in volts RMS (root-mean-square) per meter; and, c) a computing device operatively connected to said signal generation instrumentation subsystem and said receiver instrumentation subsystem and capable of matching the data received from said receiver instrumentation subsystem with the low-level test current injected at each test location by said signal generation instrumentation subsystem, and analyzing such data to provide an overall assessment of the ability of said structure to adequately dissipate the energy of a lightning strike in order to determine a safe stand-off distance for critical assets or personnel within the structure;

ii) injecting a plurality of low-level test currents into each said test locations, each said test current at a specific test frequency and allowing each said injected test current at each specific test frequency to flow through any metallic or other conductive elements of said structure, into the surrounding earth beneath the structure;

iii) measuring the electromagnetic fields;

iv) calculating the transfer functions for each test location selected for said structure; and, v) determining the internal energy levels that lightning strikes would cause inside the structure using probable models of a lightning event at these various test points in order to determine a safe stand-off distance for critical assets or personnel within said structure.

* * * * *